(12) United States Patent
Jeong et al.

(10) Patent No.: US 9,995,636 B2
(45) Date of Patent: Jun. 12, 2018

(54) TEMPERATURE SENSING SYSTEM FOR SWITCHING DEVICE

(71) Applicant: Hyundai Motor Company, Seoul (KR)

(72) Inventors: Kang Ho Jeong, Gyeonggi-Do (KR); Ki Jong Lee, Gyeonggi-Do (KR); Jee Hye Jeong, Gyeonggi-Do (KR)

(73) Assignee: Hyundai Motor Company, Seoul (KR)

( * ) Notice: Subject to any disclaimer, the term of this patent is extended or adjusted under 35 U.S.C. 154(b) by 765 days.

(21) Appl. No.: 14/567,434

(22) Filed: Dec. 11, 2014

(65) Prior Publication Data

US 2016/0084717 A1 Mar. 24, 2016

(30) Foreign Application Priority Data

Sep. 22, 2014 (KR) .......................... 10-2014-0125702

(51) Int. Cl.
| | | |
|---|---|---|
| *G01K 7/00* | (2006.01) | |
| *G01K 7/01* | (2006.01) | |
| *B60R 16/02* | (2006.01) | |
| *G01K 13/00* | (2006.01) | |
| *H03K 17/14* | (2006.01) | |
| *H03K 17/567* | (2006.01) | |

(52) U.S. Cl.
CPC ................ *G01K 7/01* (2013.01); *B60R 16/02* (2013.01); *G01K 13/00* (2013.01); *H03K 17/14* (2013.01); *H03K 17/567* (2013.01)

(58) Field of Classification Search
USPC .......................... 374/170, 178; 327/512, 513
See application file for complete search history.

(56) References Cited

U.S. PATENT DOCUMENTS

| | | | |
|---|---|---|---|
| 3,672,215 A | 6/1972 | Stout et al. | |
| 3,791,217 A | 2/1974 | Stout et al. | |
| 3,996,451 A | 12/1976 | Harrington et al. | |
| 4,206,646 A * | 6/1980 | Spellman ............... | G01D 5/246 323/245 |
| 4,485,449 A * | 11/1984 | Knauss .................... | G01K 3/08 165/11.1 |

(Continued)

FOREIGN PATENT DOCUMENTS

| | | |
|---|---|---|
| EP | 2270453 A1 | 1/2011 |
| JP | 2006-302977 A | 11/2006 |

(Continued)

*Primary Examiner* — Mirellys Jagan
(74) *Attorney, Agent, or Firm* — Mintz Levin Cohn Ferris Glovsky and Popeo, P.C.; Peter F. Corless

(57) ABSTRACT

A temperature sensing system for a switching device is provided The temperature sensing system includes a sensing device that is configured to sense a temperature of the switching device and a signal converter that is configured to output a digital signal having a frequency based on a voltage across the sensing device by a frequency variable method which receives the voltage across the sensing device which is a temperature sensing value when a current flows in the sensing device to convert a level of an analog signal into a frequency of the digital signal. An isolator is configured to be connected to an output terminal of the signal converter to isolate and transmit the digital signal output from the signal converter. The system also includes a controller configured to recognize the temperature from the frequency of the digital signal transmitted through the isolator.

20 Claims, 3 Drawing Sheets

(56) References Cited

U.S. PATENT DOCUMENTS

| | | | | |
|---|---|---|---|---|
| 5,519,644 A | * | 5/1996 | Benton | G01K 1/026 374/132 |
| 5,788,376 A | * | 8/1998 | Sultan | G01K 7/343 361/282 |
| 6,084,462 A | | 7/2000 | Barker | |
| 2008/0238563 A1 | * | 10/2008 | Kim | G01K 7/32 331/176 |
| 2009/0129438 A1 | * | 5/2009 | Pan | G01K 7/01 374/170 |
| 2013/0285739 A1 | * | 10/2013 | Blaquiere | G01B 31/318555 327/565 |
| 2013/0322487 A1 | * | 12/2013 | Watanabe | G01K 7/02 374/4 |
| 2015/0117492 A1 | * | 4/2015 | Takihara | H02M 1/32 374/152 |
| 2015/0285691 A1 | * | 10/2015 | Caffee | G01K 7/24 374/184 |
| 2015/0355037 A1 | * | 12/2015 | Cottin | G01K 7/32 374/1 |
| 2016/0054183 A1 | * | 2/2016 | Yayama | G01K 15/005 374/1 |
| 2017/0163265 A1 | * | 6/2017 | Kano | H03B 5/24 |

FOREIGN PATENT DOCUMENTS

| | | |
|---|---|---|
| JP | 2010-261913 A | 11/2010 |
| JP | 2010-273042 A | 12/2010 |
| JP | 2011-010468 A | 1/2011 |
| JP | 2011-027265 A | 2/2011 |
| JP | 2011-027625 A | 2/2011 |
| JP | 2011-109592 A | 6/2011 |
| KR | 10-2007-0003047 A | 1/2007 |
| KR | 10-2008-0025284 | 3/2008 |
| KR | 10-2010-0074816 A | 7/2010 |
| KR | 10-2012-0065369 | 6/2012 |

* cited by examiner

TEMPERATURE SENSING SYSTEM FOR SWITCHING DEVICE

CROSS-REFERENCE TO RELATED APPLICATION(S)

Pursuant to 35 U.S.C. § 119(a), this application claims priority to Korean Patent Application No. 10-2014-0125702, filed on Sep. 22, 2014, the entire contents of which are incorporated herein by reference.

BACKGROUND

Technical Field

The present disclosure relates to a temperature sensing system for a switching device and more particularly, to a temperature sensing system capable of effectively solving a signal processing problem for transmission isolation between an IGBT module which is a substantially high-voltage side and a controller which is a low-voltage side while increasing accuracy of temperature sensing by utilizing diode type IGBT temperature sensing using a diode mounted in an IGBT as a switching device.

Background Art

Generally, environmentally friendly vehicles, such as an electric vehicle, a hybrid electric vehicle, and a fuel cell vehicle, are equipped with a motor system which includes a driving motor for driving a vehicle and an inverter for converting a direct current (DC) voltage from a substantially high voltage power supply into an alternating current (AC) voltage to drive a motor. In this configuration, the driving motor is driven by a 3-phase current which is transferred from the inverter through a power cable and the inverter is configured to switch the switching device with a pulse width modulation (PWM) signal of the controller to convert the DC voltage from the substantially high voltage power supply into the AC voltage.

The switching device used as a power module in the typical inverter includes an insulated gate bipolar transistor (hereinafter, referred to as "IGBT") which may be configured to perform a high-speed switching operation even when using substantial power. In environmentally friendly vehicles, the above-mentioned inverter as well as a power conversion apparatus such as a direct current to direct current (DC-DC) converter, which has been used in various circuits within a vehicle, makes uses IGBT as the power switching device. Meanwhile, since a capacity of current which is transferred or cut off during the switching operation is substantial, the IGBT module may be damaged due to overtemperature or overcurrent experienced during operation.

Therefore, a temperature sensor configured to measure temperature and which may prevent the IGBT module from being damaged due to conditions such as overtemperature, overcurrent, and the like may be disposed within the IGBT module and in particular, may be disposed on direct bonded copper (DBC) of the IGBT module. For a typical temperature sensor, such as a negative temperature coefficient (NTC) thermistor in which an electric resistance is continuously changed based on a temperature, has been used. The NTC thermistor may be configured to perform temperature sensing using a resistance value which is changed based on temperature. For example, a temperature may be predicted by a voltage difference value measured between the NTC thermistor which is the temperature sensor and another resistor.

However, when using an NTC thermistor, as illustrated in FIG. 1, the temperature of the IGBT module may be sensed and graphed as a non-linear curve, and therefore resolution at a substantially high-temperature, where accuracy may be required is reduced. As a result, accurate sensing of a temperature may be difficult. The NTC thermistor does not directly sense the temperature of the IGBT device but instead, uses an indirect sensing method in when the NTC thermistor is mounted on the DBC, and as a result, accurate measurement of temperature may be difficult. The temperature of the DBC, on which the temperature sensor may be disposed, is approximately the same as that of a cooler (a type of heat sink having a cooling water circulation path provided therein) contacting a bottom surface of the DBC, and as a result, a junction temperature of a semiconductor chip (which generates heat and therefore an electrical signal exchange operation within the IGBT module may not be accurately measured. In other words, for the temperature sensor to measure the junction temperature of the semiconductor chip which generates heat, there is a need to monitor the temperature of cooling water within the cooler contacting the DBC, which may lead to inaccurate junction temperature measurement of the semiconductor chip.

To protect the junction temperature of the semiconductor chip, calculation of the junction temperature is desirable. However, a calculation error may be substantial while estimating the junction temperature using a thermal model and the configuration of such a model has proven to be difficult. When the junction temperature of the semiconductor chip is calculated, the calculated junction temperature may fit a prediction of the junction temperature by a thermal model and the heat value estimation during normally driving the inverter. However, in a hill hold mode, used to prevent a vehicle from going backwards down an uphill road by adjusting a torque of the driving motor by the inverter, estimation of the junction temperature of the semiconductor chip may be difficult and errors occurring at each sample frequency when the variable switching of the inverter are substantial, such that an overtemperature protection operation for the IGBT module including the semiconductor chip may not be accurately performed. The temperature estimation substituted into the logic for protecting the overtemperature and the overcurrent during the failure of the current sensor may be inaccurate and thus the overtemperature protection may not be properly performed. Accordingly, the IGBT module may be damaged while driving the environmentally-friendly vehicle, causing unsafe driving of the vehicle.

A method for embedding a temperature sensor in a semiconductor chip rather than a method for disposing a temperature sensor on a DBC substrate has been developed. In other words, the temperature of the module may be directly sensed and the semiconductor junction temperature may be more precisely measured by mounting a diode, (which may solve non-linear characteristics of the NTC thermistor), in the IGBT semiconductor device. However, accurate temperature sensing may be performed by the diode mounted therein, but there remains a need to electrically isolate the IGBT (which is the substantially high-voltage side) from the control element (which is the low-voltage side), recognizing the temperature using the sensing signal for t safety, thereby improving transmission isolation in aspects of signal processing.

The above information disclosed in this background section is merely for enhancement of understanding of the background of the invention and therefore it may contain information that does not form the prior art that is already known in this country to a person of ordinary skill in the art.

SUMMARY

The present invention provides a temperature sensing system for a switching device, that may include: a sensing device configured to sense a temperature of the switching device; a signal converter configured to output a digital signal having a frequency based on a voltage across the sensing device by a frequency variable method which receives the voltage across the sensing device which is a temperature sensing value when a current flows in the sensing device to convert a level of an analog signal into a frequency of the digital signal; an isolator configured to be connected to an output terminal of the signal converter to isolate and transmit the digital signal output from the signal converter; and a controller configured to recognize the temperature from the frequency of the digital signal transmitted through the isolator.

The switching device may include an insulated gate bipolar transistor (IGBT) and the sensing device may include a diode. The signal converter may include a voltage controlled oscillator (VOC) having operation characteristics in which the frequency of the output signal varies based on an input voltage. The isolator may be a photo coupler disposed between the output terminal of the signal converter and an input terminal of the controller to isolate the digital signal output from the signal converter and transmit the isolated digital signal to the controller. A power supply unit may be configured to apply a current to the sensing device and supply power to the signal converter and may include a regulator configured to smooth and output power to an output terminal to more stably supply power to a diode and a VCO. Additionally, the regulator may be a low drop output (LDO) device connected to apply the smoothed power to the diode and the VCO. In addition, the power supply unit may include a DC-DC converter configured to convert and output a DC voltage from a battery into a different DC voltage level required in the diode and the VCO.

Therefore, the temperature sensing system according to the exemplary embodiments of the present invention may have the following effects.

First, it may be possible to maintain a more accurate temperature sensing provided by the method using a diode mounted in an IGBT by configuring the voltage controlled oscillator to receive a voltage across the diode (which is the analog temperature sensing signal) to output the digital signal. The digital signal may be the frequency variable PWM signal based on the input voltage (by conversion of the level of the analog signal into the frequency of the digital signal by the change in frequency). Additionally, transmission of the frequency variable PWM signal to the controller through the isolator device may be possible. Further, the module may be prevented from being damaged due to the overtemperature by using more accurate sensing values, and the IGBT may be protected from overtemperature and use of the maximum output of the IGBT by the accurate temperature measurement may also all be possible.

It may also be possible to protect the controller (micom) (which is the low-voltage side for signal transmission), by providing the isolation connection between the IGBT module (which is the high-voltage side) for signal transmission) and to protect the controller (micom) which is the low-voltage side by an isolator device (such as a photo coupler) to provide transmission isolation for the digital signal.

BRIEF DESCRIPTION OF THE DRAWINGS

The above and other objects, features and other advantages of the present invention will be more clearly understood from the following detailed description when taken in conjunction with the accompanying drawings, in which.

Figure 1:
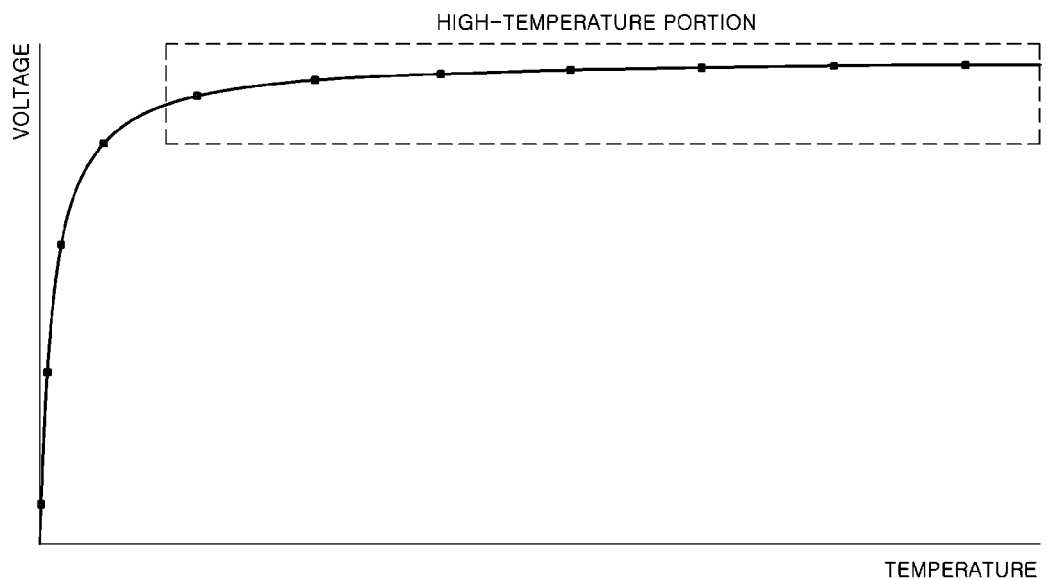
FIG. 1 is an exemplary diagram illustrating a characteristic graph of an NTC thermistor used as a temperature sensor according to the related art.

Reference numerals set forth in the Drawings include reference to the following elements as further discussed below:

10: IGBT
21: diode
22: voltage controlled oscillator (VCO)
23: isolator
24: micom (controller)

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiments are described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular exemplary embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter reference will now be made in detail to various exemplary embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

The present invention relates to a temperature sensing system for a switching device and may provide a temperature sensing system capable of effectively solving a signal processing problem for transmission isolation between an IGBT module which is a substantially high-voltage side and a controller which is a low-voltage side while increasing the accuracy of temperature sensing by utilizing a diode type IGBT temperature sensor using a diode mounted in an IGBT, as an example of a switching device. For this purpose, exemplary embodiments of the present invention may be configured to convert an analog value of an IGBT temperature into a digital signal using a voltage controlled oscillator (VCO) and a frequency variable PWM method and then perform transmission isolation to a controller (or a micom within a controller.

Figure 2:
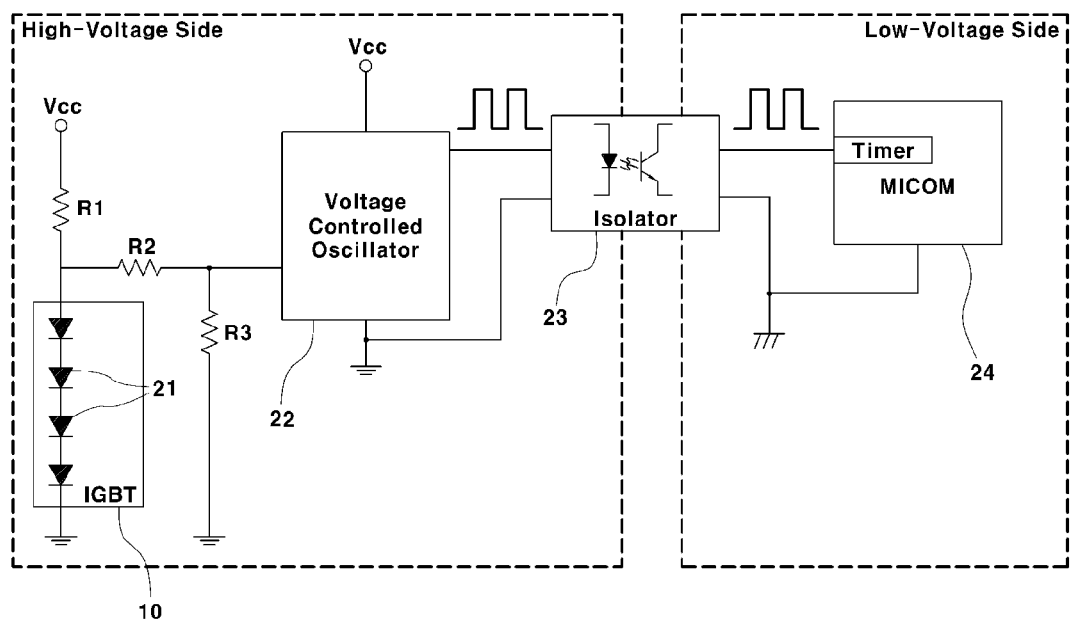
FIG. 2 is an exemplary diagram illustrating a temperature sensing system according to an exemplary embodiment of the present invention.

FIG. 2 is an exemplary diagram illustrating a circuit configuration for temperature sensing of an IGBT module according to an exemplary embodiment of the present invention. As illustrated in FIG. 2, the temperature sensing system may include a diode 21, a voltage controlled oscillator (VCO) 22, an isolator 23, and a controller 24. First, as the sensing device configured to sense a temperature of the IGBT 10, one diode 21 or a plurality of diodes 21 connected in series, may be mounted in the IGBT 10 (disposed at a, high-voltage side), and a circuit may be configured to allow a bias current flow in the diode 21, (i.e., the temperature sensor), from a constant power supply Vcc through a resistor R1. In the above circuit, the diode 21 may be integrated at a heat generation portion within the IGBT, (e.g., at a position adjacent to a semiconductor chip, and the like) to be used as the sensing device configured to sense the temperature of the IGBT 10 and connect between the power supply Vcc and the resistor R1, thereby allowing a substantially constant current flow in an input terminal of the diode 21.

Figure 3:
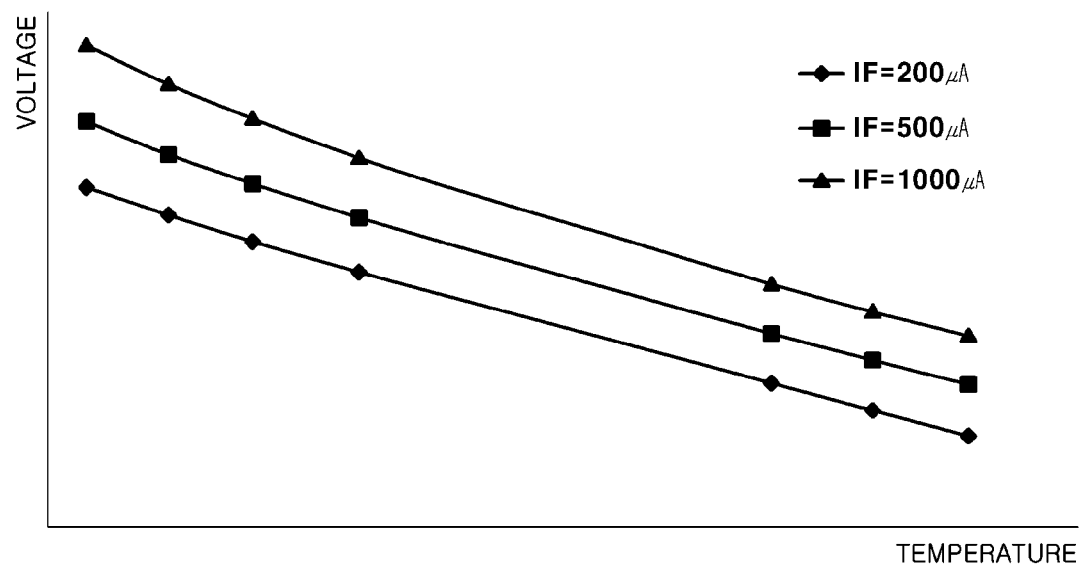
FIG. 3 is an exemplary diagram illustrating a temperature characteristic graph of a diode used as a sensing device according to an exemplary embodiment of the present invention.

FIG. 3 illustrates several temperature characteristic curves corresponding to three diode forward currents (IF). In the above circuit, when a current flows in the diode 21, as illustrated in the diode temperature characteristic graph of FIG. 3, the greater the temperature of the IGBT 10, the lower the voltage across the diode 21 and the lower the temperature, the greater the voltage across the diode. Depending on the diode temperature characteristics, the above-mentioned circuit represents the junction temperature of the IGBT device as an analog voltage value.

The temperature sensing system according to the exemplary embodiment of the present invention may include a voltage controlled oscillator 22 (hereinafter, referred to as "VCO") which may be configured to receive the voltage across the diode to convert a level of an analog input signal into a frequency of a digital output signal. The VCO 22 may be configured to operate a signal converter configured to convert an analog signal into a digital signal. Further, the VCO may be configured to digitalize (i.e. to convert an analog signal into a digital signal) the analog voltage signal (i.e., the sensed temperature value) by a frequency variable method and output the digital signal, and output a PWM signal having a frequency based on the input analog voltage value (i.e., voltage value across the diode). The VCO 22 may include a general commercially available integrated circuit (IC) and may have output characteristics in which its frequency varies based on an IC input voltage input through an 'SET' terminal (i.e., an input terminal).

Figure 4:
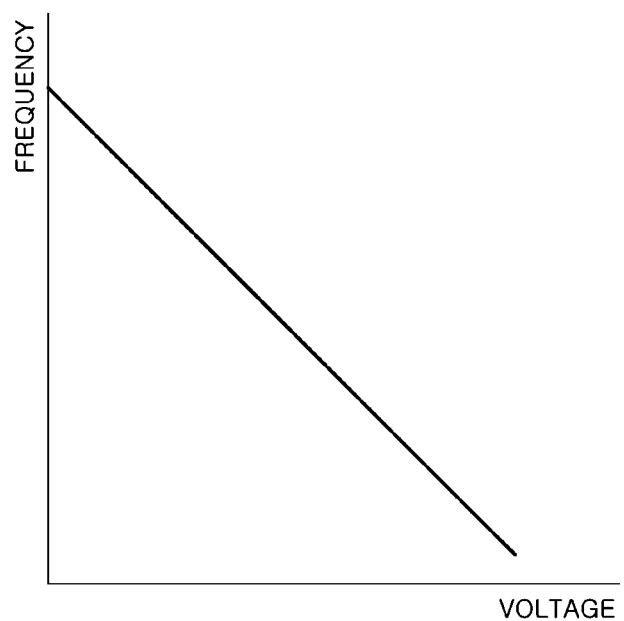
FIG. 4 is an exemplary diagram illustrating output characteristics of a voltage controlled oscillator according to an exemplary embodiment of the present invention.

FIG. 4 is an exemplary diagram illustrating output characteristics of a VCO IC according to an exemplary embodiment of the present invention and illustrates that as the input voltage is increased, the output digital signal has a decreased frequency. For example, when the voltage across the diode is about 1.5 V, the PWM signal at about 250 kHz is output and when the voltage across the diode is about 0.5 V, the PWM signal at about 750 kHz is output.

The frequency variable PWM signal may be converted and output into the digital signal by the VCO 22, (that is, the PWM signal having a frequency based on the voltage across the diode). The PWM signal may be a transmission isolation signal to the controller 24. Accordingly, a digital isolator 23 may be applied. A digital isolator 23 is a component which isolates between the diode 21 and the VCO 22 within the high-voltage side and the controller 24 (which is the low-voltage side), noting that a photo coupler may be implemented as the isolator 23. The isolator 23 may be configured to provide the isolation connection and the signal transmission connection between the output terminal of the VCO 22 and the input terminal of the controller 24 and to transmit the frequency variable PWM signal to the controller 24 while isolating the frequency variable PWM signal output from the VCO 22. The controller 24 may be configured to recognize a frequency of the PWM signal transmitted and input through the isolator 23 using a timer (or counter) and recognize the temperature value of the IGBT 10 based on the frequency.

Figure 5:
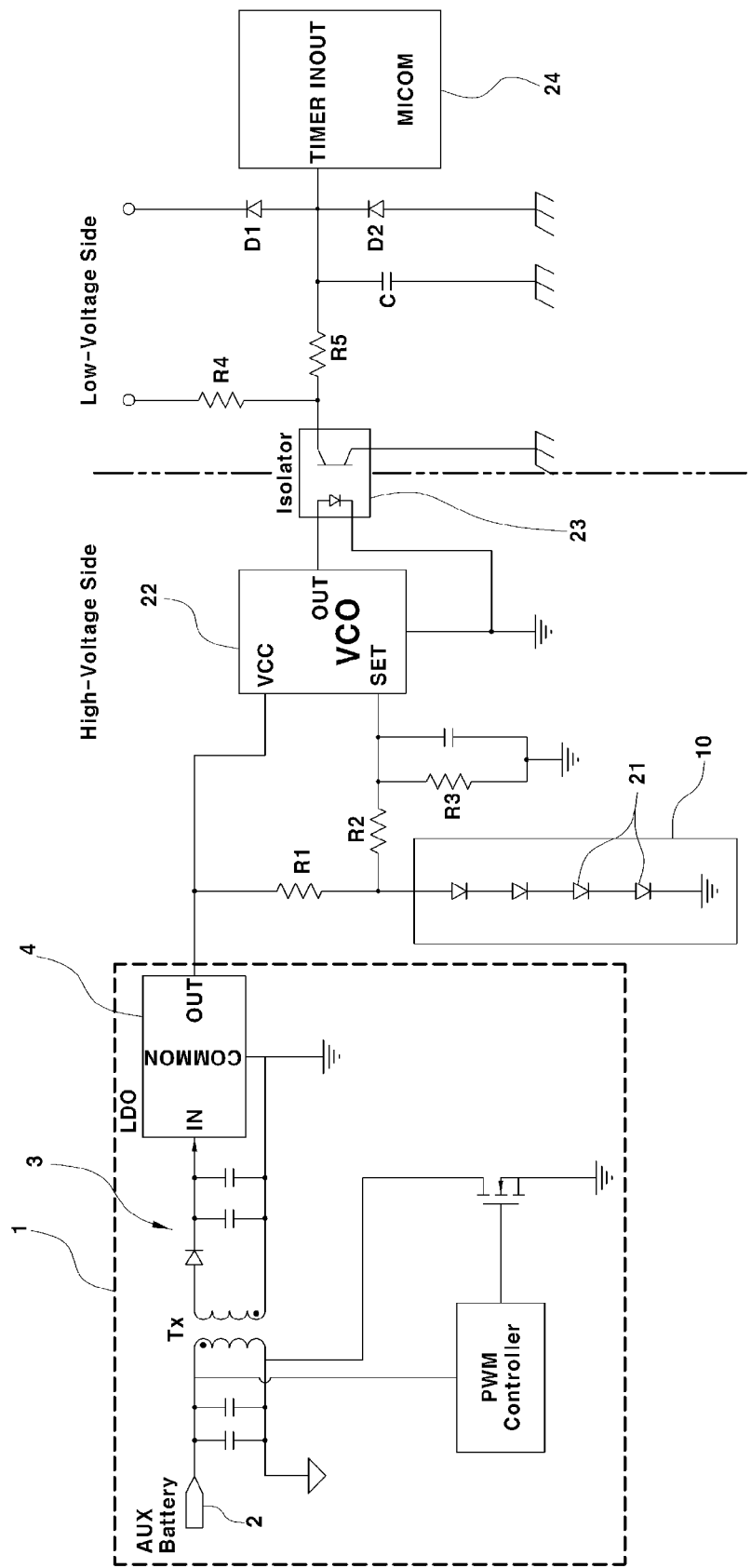
FIG. 5 is an exemplary circuit diagram illustrating in detail a circuit configuration of the temperature sensing system according to the exemplary embodiment of the present invention.

FIG. 5 is an exemplary circuit diagram illustrating in more detail a circuit configuration of the temperature sensing system according to an exemplary embodiment of the present invention and illustrates a circuit configuration of a power supply unit 1 for driving the diode 21 and the VCO 22. As illustrated, the power supply unit 1 may be configured to apply a current to the diode 21 (which is the temperature sensing device) and may be configured to supply power for driving the VCO 22. The power supply unit 1 may include a DC-DC converter 3 which may be configured to convert and output power from an auxiliary battery 2. The DC-DC converter 3 may include a transformer Tx which may be configured to convert a DC voltage from the auxiliary battery 2 into a DC voltage having a predetermined voltage level required in the diode 21 and the VCO 22. Further, the circuit configuration of the converter 3 may be variously changed in addition to the configuration illustrated in the drawings.

The power supply unit 1 may include a regulator 4 configured to smooth the output power of the DC-DC converter 3 at the output terminal to more stably supply the DC power to the diode 21 and the VCO 22 to output at a substantially constant, fixed voltage. The regulator 4 may include a low drop output (LDO) device as the commercial IC. The LDO device may be configured to smooth the output of the DC-DC converter 3 to apply the substantially constant voltage to the diode 21 and the VCO. In the circuit configuration of FIG. 5, a circuit may be configured using resistors R1, R2, and R3 for voltage division in the circuit configuration of FIG. 5, the voltage across the diode may be input to the VCO 22 while allowing a current flow in the diode 21.

In the circuit configuration of FIG. 5, the circuit configuration of the latter stage of the isolator 23 is illustrated. This circuit configuration includes resistors R4 and R5, a capacitor C, and diodes D1 and D2 as an example of the circuit configuration required to drive the isolator, (such a configuration may be changed in various ways and remain within the scope of the present invention). Accordingly, the VCO may be configured to receive the voltage across the diode (i.e., the analog temperature sensing signal) to output the digital signal, (i.e., the frequency variable PWM signal based on the input voltage) and transmit the frequency variable PWM signal to the controller via the isolator, to secure more accurate sensing of temperature provided by the method using the diode mounted in the IGBT.

The module may be prevented from being damaged due to overtemperature by using the more accurate sensing values and the IGBT may be protected from overtemperature and use of the maximum output of the IGBT by the accurate temperature measurement may also all be possible. It may also be possible to protect the controller (micom), by providing an isolation connection between the IGBT module and the controller by use of an isolator device such as a photo coupler to provide the transmission isolation of the digital signal.

The invention has been described in detail with reference to exemplary embodiments thereof. However, it will be appreciated by those skilled in the art that changes may be made in these exemplary embodiments without departing from the principles and spirit of the invention, the scope of which is defined in the appended claims and their equivalents.

What is claimed is:

1. A temperature sensing system for a switching device, comprising:
    a temperature sensor configured to sense a temperature of the switching device;
    a signal converter configured to output a digital signal having a frequency based on a voltage across the temperature sensor by a frequency variable method which receives the voltage across the temperature sensor corresponding to a sensed temperature value when a current flows in the temperature sensor to convert a level of an analog signal into a frequency of the digital signal;
    an isolator configured to be electrically connected to an output terminal of the signal converter to isolate and transmit the digital signal output from the signal converter; and
    a controller configured to recognize the temperature from the frequency of the digital signal transmitted through the isolator.

2. The system of claim 1, wherein the switching device is an insulated gate bipolar transistor (IGBT).

3. The system of claim 1, wherein the temperature sensor includes a diode.

4. The system of claim 1, wherein the signal converter includes a voltage controlled oscillator (VCO) having operation characteristics in which the frequency of the output signal varies based on an input voltage.

5. The system of claim 1, wherein the isolator includes a photo coupler disposed between the output terminal of the signal converter and an input terminal of the controller to isolate the digital signal output from the signal converter and transmit the isolated digital signal to the controller.

6. The system of claim 1, further comprising:
    a power supply configured to apply a current to the temperature sensor and supply power to the signal converter,
    wherein the power supply includes a regulator configured to smooth and output power to an output terminal to more stably supply power to a diode and a VCO.

7. The system of claim 6, wherein the regulator includes a low drop output (LDO) device configured to apply the smoothed power to the diode and the VCO.

8. The system of claim 6, wherein the power supply includes a direct current to direct current (DC-DC) converter configured to convert and output a first DC voltage from a battery into a second DC voltage, wherein the second DC level is a voltage required in the diode and the VCO.

9. A non-transitory computer readable medium containing program instructions executed by a processor for a temperature sensing system, the computer readable medium comprising:
    program instructions that operate a temperature sensor configured to sense a temperature of a switching device;
    program instructions that operate the temperature sensor to sense a temperature of the switching device;
    program instructions that operate a signal converter to output a digital signal having a frequency based on a voltage across the temperature sensor by a frequency variable method which receives the voltage across the temperature sensor corresponding to a sensed temperature value when a current flows in the temperature sensor to convert a level of an analog signal into a frequency of the digital signal;

program instructions that operate an isolator to be electrically connected to an output terminal of the signal converter to isolate and transmit the digital signal output from the signal converter; and program instructions that recognize the temperature from the frequency of the digital signal transmitted through the isolator.

10. The non-transitory computer readable medium of claim 9, wherein the switching device includes an insulated gate bipolar transistor (IGBT).

11. The non-transitory computer readable medium of claim 9, wherein the temperature sensor includes a diode.

12. The non-transitory computer readable medium of claim 9, wherein the signal converter includes a voltage controlled oscillator (VCO) having operation characteristics in which the frequency of the output signal varies based on an input voltage.

13. The non-transitory computer readable medium of claim 9, wherein the isolator includes a photo coupler disposed between the output terminal of the signal converter and an input terminal of the controller to isolate the digital signal output from the signal converter and transmit the isolated digital signal to the controller.

14. The non-transitory computer readable medium of claim 9, wherein a power supply unit for applying a current to the temperature sensor and supplying power to the signal converter includes a regulator configured to smooth and output power to an output terminal to stably supply power to a diode and a VCO.

15. The non-transitory computer readable medium of claim 14, wherein the regulator includes a low drop output (LDO) device connected to apply the smoothed power to the diode and the VCO.

16. The non-transitory computer readable medium of claim 14, wherein the power supply unit includes a direct current to direct current (DC-DC) converter configured to convert and output a first DC voltage from a battery into a second DC voltage, wherein the second DC level is a voltage required in the diode and the VCO.

17. An environmentally-friendly vehicle comprising:
a temperature sensing system for a switching device, including:
a temperature sensor configured to sense a temperature of the switching device;
a signal converter configured to output a digital signal having a frequency based on a voltage across the temperature sensor by a frequency variable method which receives the voltage across the temperature sensor corresponding to a sensed temperature value when a current flows in the temperature sensor to convert a level of an analog signal into a frequency of the digital signal;
an isolator configured to be electrically connected to an output terminal of the signal converter to isolate and transmit the digital signal output from the signal converter; and
a controller configured to recognize the temperature from the frequency of the digital signal transmitted through the isolator.

18. The environmentally-friendly vehicle of claim 17, wherein the switching device is an insulated gate bipolar transistor (IGBT).

19. The environmentally-friendly vehicle of claim 17, wherein the temperature sensor includes a diode.

20. The environmentally-friendly vehicle of claim 17, wherein the signal converter includes a voltage controlled oscillator (VCO) having operation characteristics in which the frequency of the output signal varies based on an input voltage.

* * * * *